(12) United States Patent
Chen et al.

(10) Patent No.: US 7,005,699 B2
(45) Date of Patent: Feb. 28, 2006

(54) NAND FLASH MEMORY CELL ROW

(75) Inventors: Shih-Chang Chen, Hsinchu (TW);
Cheng-Yuan Hsu, Hsinchu (TW);
Chih-Wei Hung, Hsin-chu (TW)

(73) Assignee: Powerchip Semiconductor Corp.,
Hsinchu (TW)

( * ) Notice: Subject to any disclaimer, the term of this patent is extended or adjusted under 35 U.S.C. 154(b) by 0 days.

(21) Appl. No.: 10/707,826

(22) Filed: Jan. 15, 2004

(65) Prior Publication Data

US 2005/0087794 A1   Apr. 28, 2005

(51) Int. Cl.
*H01L 29/788*   (2006.01)

(52) U.S. Cl. .................. 257/315; 257/314; 257/316;
257/321; 257/438; 438/260; 438/267; 438/254;
438/257; 438/253; 438/259

(58) Field of Classification Search ............ 257/314,
257/315, 316, 321, 438; 438/260, 267, 254,
438/257, 253, 259
See application file for complete search history.

(56) References Cited

U.S. PATENT DOCUMENTS 6,248,631 B1 *   6/2001   Huang et al. ............... 438/260

* cited by examiner

*Primary Examiner*—Mai-Huong Tran
(74) *Attorney, Agent, or Firm*—Jiang Chyun IP Office

(57) ABSTRACT

A NAND flash memory cell row includes first and second stacked gate structures, control and floating gates, intergate dielectric layer, tunnel oxide layer, doping regions and source/drain regions. The first stacked gate structures has an erase gate dielectric layer, an erase gate and a first cap layer. The second stacked gate structure has a select gate dielectric layer, a select gate and a second cap layer. The control gate is between each of the first stacked gate structures, and between each of the second stacked gate structures and adjacent first stacked gate structure. The floating gate is between the control gate and substrate. The inter-gate dielectric layer is between the control and floating gates. The tunnel oxide is between the floating gate and substrate. The doping regions are under the first stacked gate structure, and the source/drain regions are in the exposed substrate.

5 Claims, 6 Drawing Sheets

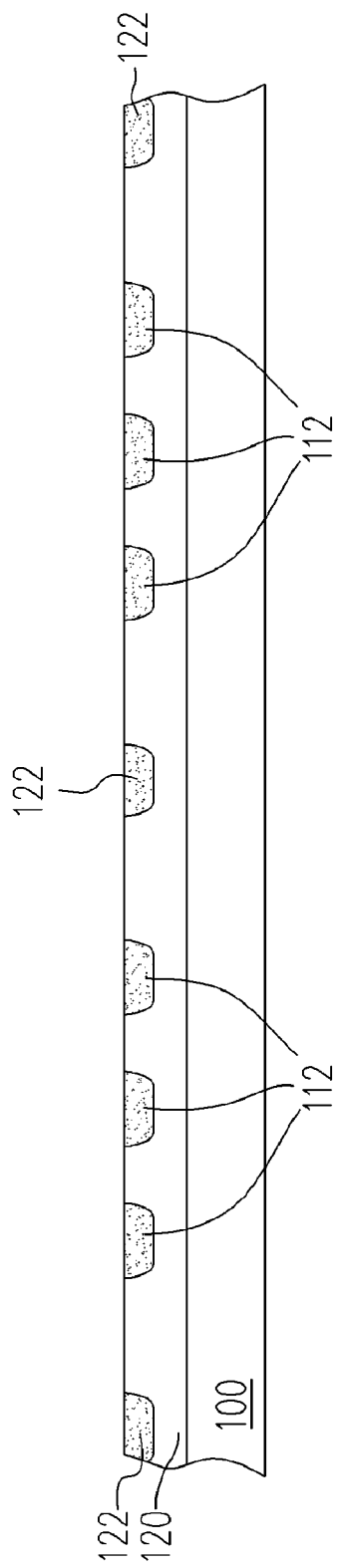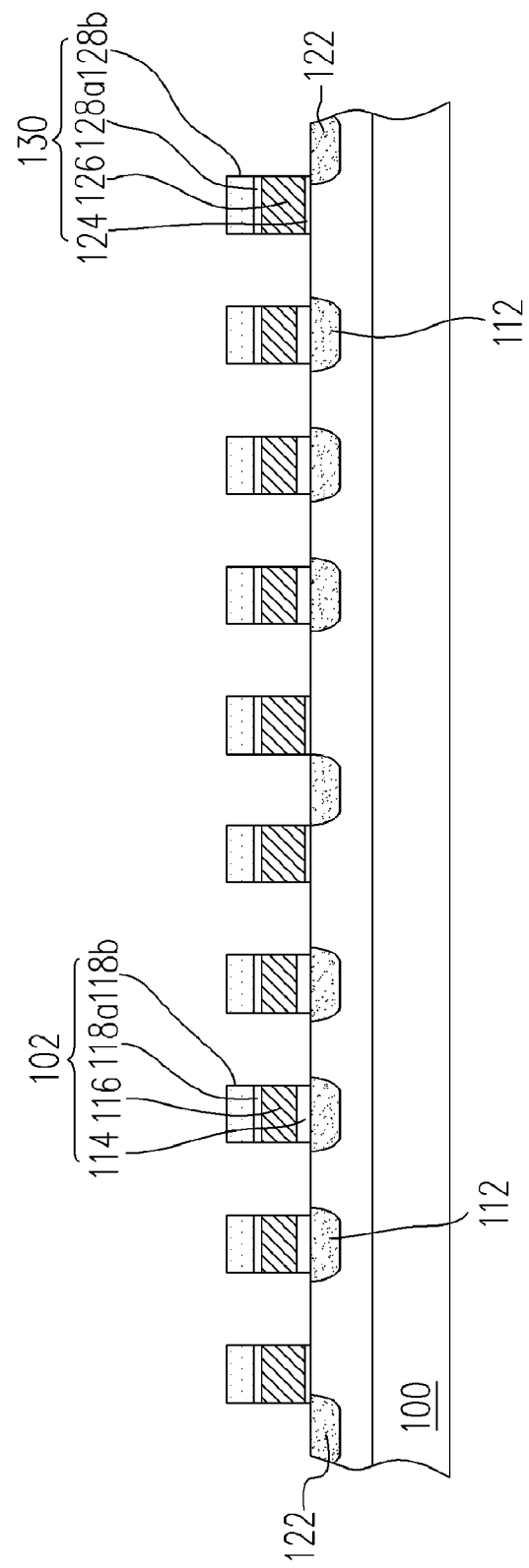

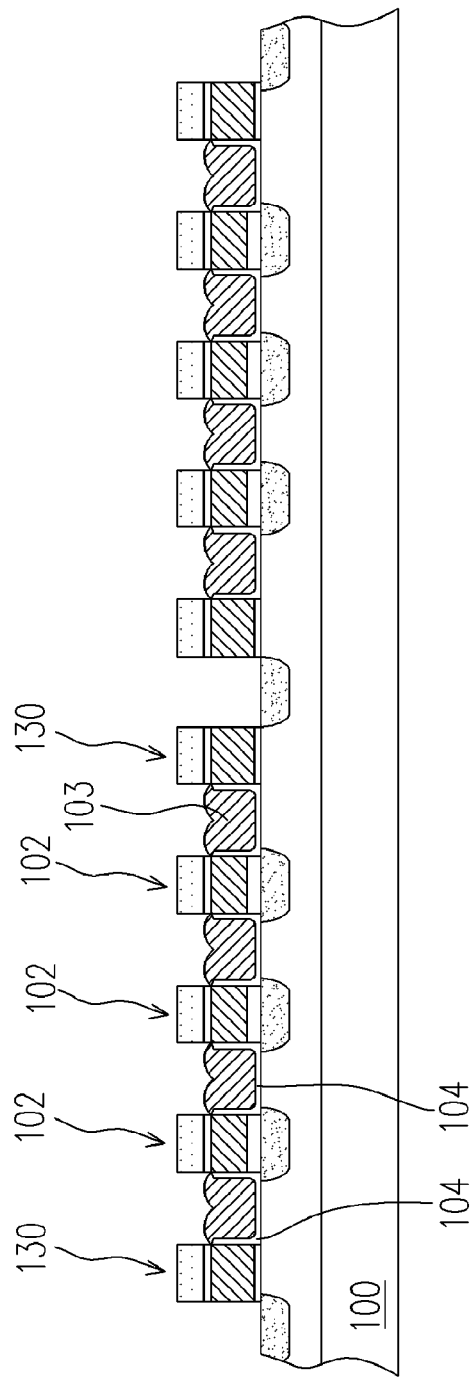
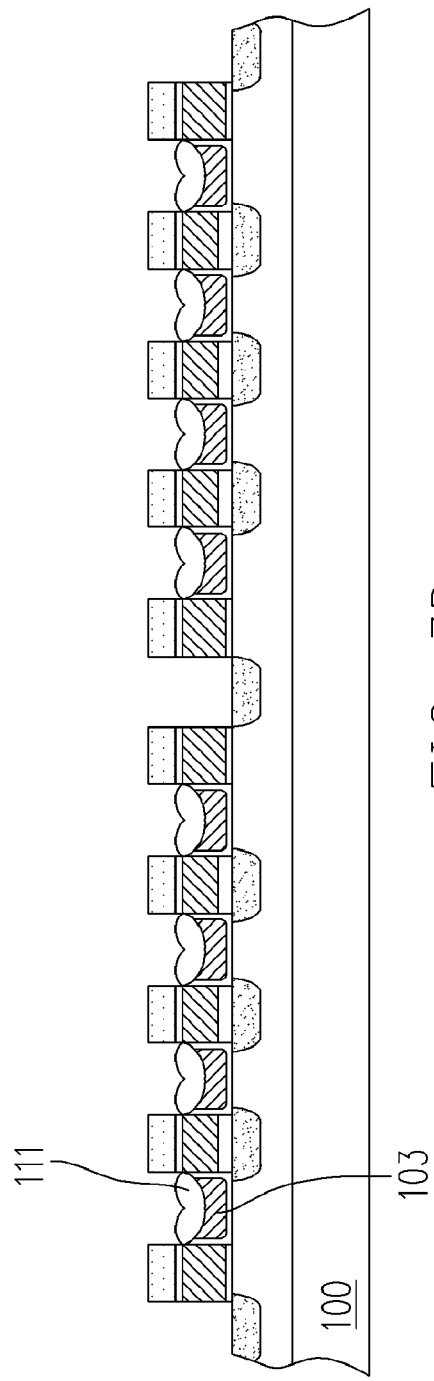
FIG. 3C
FIG. 3D

NAND FLASH MEMORY CELL ROW

BACKGROUND OF INVENTION

1. Field of the Invention

The present invention generally related to a flash memory device. More particularly, the present invention relates to a NAND flash memory cell row and the manufacturing method thereof.

2. Invention of Related Art

In recent years, flash memory device has become the main stream of the non-volatile memory device since that type of memory device allows for multiple data writing, loading and erasing operations. In addition, the stored data can be preserved even the power of the memory device is removed.

In a conventional flash memory device, generally the floating gate and control gate of are manufactured wit doped amorphous silicon. In a stacked gate flash memory device, the control gate is disposed on the floating gate directly, a dielectric layer is disposed between the floating gate and the control gate, and a tunnel oxide layer is disposed between the floating gate and the substrate.

When a writing operation of data is provided for a flash memory, a bias voltage is applied to the control gate and the source/drain regions to inject the electrons into the floating gate. When the data stored in the flash memory is loaded, a working voltage is applied to the control gate, and the charging condition of the floating gate will effect the on/off of the channel below, wherein the on/off of the channel corresponds to the binary data "0" or "1". When the data stored in the flash memory is erased, the voltage of the substrate, drain (source) or the control gate is increased, and the electrons in the floating gate will move into the substrate or drain (source) via the tunnel oxide layer due to the tunneling effect. The erase method is generally named as "substrate erase" or "drain (source) side erase". Alternatively, the electrons in the floating gate can also move into the control gate via the dielectric layer.

In the operation of the flash memory, when the gate coupling ratio (GCR) between the floating gate and the control gate is increased, the working voltage of the operation reduces. Thus the operation speed and efficiency of the flash memory increases drastically. The method of increasing the gate coupling ratio includes the increasing of the overlap area between the floating gate and the control gate. However, when the size of the integrated circuit device is minimized, the junction area of the conventional control gate and floating gate is also reduced; thus, the gate coupling ratio and the performance of the memory device is reduced.

Further, the conventional flash memory array includes the NOR array structure and the NAND array structure. Since in the NAND array structure, the memory cells are connected in series, the integration of the NAND array structure is larger than that of the NOR array structure. However, the writing and the loading procedure of the memory cell of the NAND array structure is more complex. For example, the programming and erase operation of the memory cell of the NAND array structure are all performed by the tunnel F-N (Fowler-Nordheim) tunneling effect to inject electrons into the floating gate via the tunnel oxide layer, and to pull out electrons from the floating gate to the substrate via the tunnel oxide layer. Therefore, the tunnel oxide layer will be damaged under high voltage operation and the stability will be reduced. Moreover, since a lot of memory cells are connected in series in the NAND array, the loading current of the memory cell is reduced; thus, the operation speed and the performance of the memory cell are also reduced.

SUMMARY OF INVENTION

Accordingly, one object of the present invention is to provide a NAND flash memory cell row to enhance the performance of a memory cell.

Another object of the present invention is to provide a manufacturing method of NAND flash memory cell row, wherein the manufacturing a NAND flash memory cell row with high erase speed can be simplified.

In order to achieve the above objects and other advantages of the present invention, a NAND flash memory cell row is provided. The NAND flash memory cell row intrudes a plurality of first stacked gate structures, second stacked gate structures, control gates, floating gates, an inter-gate dielectric layer, a tunnel oxide, a plurality of doping regions and a plurality of sourced drain regions. The first stacked gate structures are disposed on a substrate, and each of the first stacked gate structures includes an erase gate dielectric layer, an erase gate and a first cap layer. The second stacked gate structures are disposed on the substrate beside two outer sides of the first stacked gate structures respectively, and each of the second stacked gate structures includes a select gate dielectric layer, a select gate and a second cap layer. The control gate is disposed between the first stacked gate structures and each of the second stacked gate structures, and between every two of the neighboring first stacked gate structured. The floating gate is disposed between the control gate and the substrate, and has a sharp corner and a concave surface facing each of the control gate. The edge of the concave surface is lower than the top surface of the erase gates. The inter-gate dielectric layer is disposed between each of the control gates and each of the floating gates. The tunnel oxide, disposed between each of the floating gates and the substrate, between each of the floating gates and the first stacked gate structures, and between each of the floating gates and the second stacked gate structures. Furthermore, the doping regions are disposed in the substrate under the first stacked gate structures, and the source/drain regions are disposed in the exposed substrate being at the outer side of the second stacked gate structures.

In another embodiment of the invention, a manufacturing method of NAND flash memory cell row is provided by the present invention. The method includes the following steps. First, a plurality of doping regions and a plurality of source/drain regions are formed in a substrate, wherein the source/drain regions are disposed at outer sides of the doping regions. Thereafter, a plurality of stacked gate structures are formed on the substrate. Each of the stacked the structures disposed on the doping regions includes at least an erase gate, and some of the stacked gate structures are disposed at a distance from the doping regions and are disposed beside the source/drain regions and includes at least a select gate. Them a tunnel oxide is formed on the substrate to cover the substrate, the erase gate and the select gate surface. A plurality of floating gates are further formed between the stacked gate structures, a top surface of the floating gate is a concave surface and has a sharp edge, wherein an edge of the concave surface is lower than the top surface of the erase gates. Then, an inter-gate dielectric layer is formed on the floating gates; and a plurality of control gates are formed on the inter-gate dielectric layer.

Accordingly, in the present invention, a surface of the floating gate of the NAND flash memory cell is provided as a concave surface. Therefore, the coupling ratio is enhanced since the junction area between the floating gate and the control gate is increased. Moreover, the edge of the floating gate is sharp since the thermal oxidation process is provided for the manufacturing of the edge of the floating gate. Subsequent to the removal of the oxide, the floating gate having a concave surface is resulted. Thus, the erase speed and the performance of the memory cell are enhanced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to 3F are cross-sectional views illustrating the process flow of a preferred embodiment of a NAND flash memory cell row according to the present invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
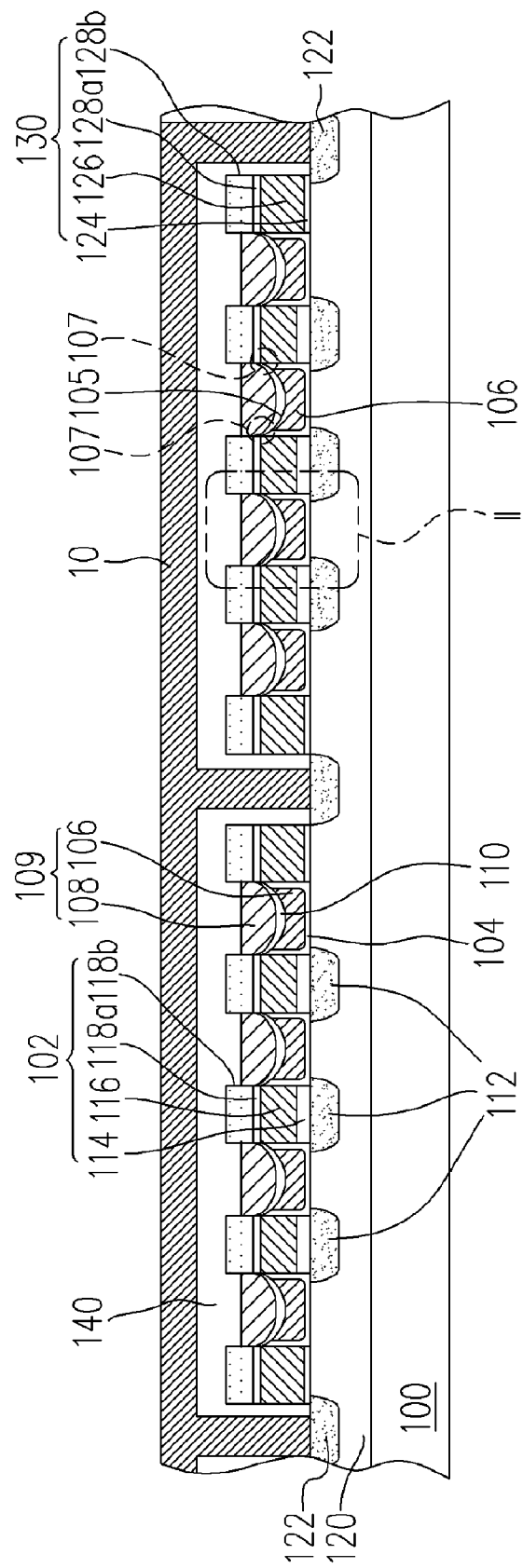
FIG. 1 is a cross-sectional view illustrating the structure of a NAND flash memory cell row according to the present invention.

FIG. 1 is a cross-sectional view illustrating the structure of a NAND flash memory cell row according to the present invention. The memory cell rows illustrated in FIG. 1 have the same bit line 10, and each memory cell row has four memory cells. However, although the number of memory cells having the same bit line shown in FIG. 1 is only 4, the number of memory cells is not limited to 4. Instead, it is dependent on the design and requirement. For example, a bit line can be connected to a structure has 32 to 64 memory cells. Hereinafter, each drawing is illustrated and described by just using a memory cell row for simplification.

Referring to FIG. 1 , the NAND flash memory cell row structure of the present invention includes at least a substrate 100, a plurality of first stacked gate structure 102, a tunnel oxide 104, a plurality of floating gate 106, a plurality of control gate 108, an inter-gate dielectric layer 110, doping regions 112, a plurality of second stacked gate structure 130 and source/drain regions 122. The first stacked gate structure 102 includes an erase gate dielectric layer 114, an erase gate 116 and a cap layer having an oxide layer 118a and a dielectric layer 118b that are sequentially disposed on the surface of the substrate. The second stacked gate structure 130 includes a select gate dielectric layer 124, a select gate 326 and a cap layer having an oxide layer 128a and a dielectric layer 128b that are sequentially disposed on the surface of the substrate.

The substrate 100 includes, for example but not limited to, a p-type silicon substrate. Furthermore, generally a p-type well region 120 is disposed in the substrate 100, and the depth of the p-type well region 120 is deeper than that of the source/drain regions 122.

The first stacked gate structure 102 is disposed on the substrate 100. The material of the erase gate dielectric layer 114 includes, for example but not limited to, a silicon oxide. The material of the erase gate 116 includes, for example but not limited to, doped amorphous silicon. The material of the dielectric layer 118b includes, for example but not limited to, silicon nitride. The material of the oxide layer 118a includes, for example but not limited to, a tetraethylorthosilicate (TEOS) oxide layer.

The stacked structure of the control gate 108 and the floating gate 106 is disposed between a plurality of the first stacked gate structure 102, and between the second stacked gate structure 130 and the first stacked gate structure 102 adjacent to the structure 130. The material of the control gate 108 includes, for example but not limited to, doped amorphous silicon. The floating gate 106 is disposed between each control gate 108 and the substrate 100, and each floating gate 106 has a concave surface 105. The concave surface 105 is faced to each control gate 108, and the edge 107 of the concave surface 105 is sharp, wherein the edge of the concave surface 105 is lower than the top surface of the erase gate 116. The stacked structures 109 constructed with the control gates 108 and the floating gates 106 are interlaced with the stacked gate structures 102.

The doping regions 112 are disposed in the substrate 100 under the first stacked gate structure 102, and connect the stacked gate structures 109 in series. The source/drain regions 122 are disposed in the exposed substrate 100 not occupied by the second stacked gate structure 130.

The tunnel oxide layers 104 are disposed between each floating gates 106 and the substrate 100, and between each floating gates 106 and the stacked gate structures 102. The material of the tunnel oxide layers 104 includes, for example but not limited to, a silicon oxide. The inter-gate dielectric layers 110 are disposed between the control gates 108 and the floating gates 106. The material of the inter-gate dielectric layer 110 includes, for example but not limited to, silicon oxide/silicon nitride/silicon oxide, silicon nitride/silicon oxide or silicon oxide/silicon nitride.

In the NAND flash memory cell row structure described above, since the floating gate 106 has a concave surface 105, the junction area between the floating gate 106 and the control gate 108 is increased. Thus the gate coupling ratio of the memory cell is also increased. Therefore, the working voltage of the operation is reduced and the operation speed and performance of the memory cell are increased.

Figure 2:
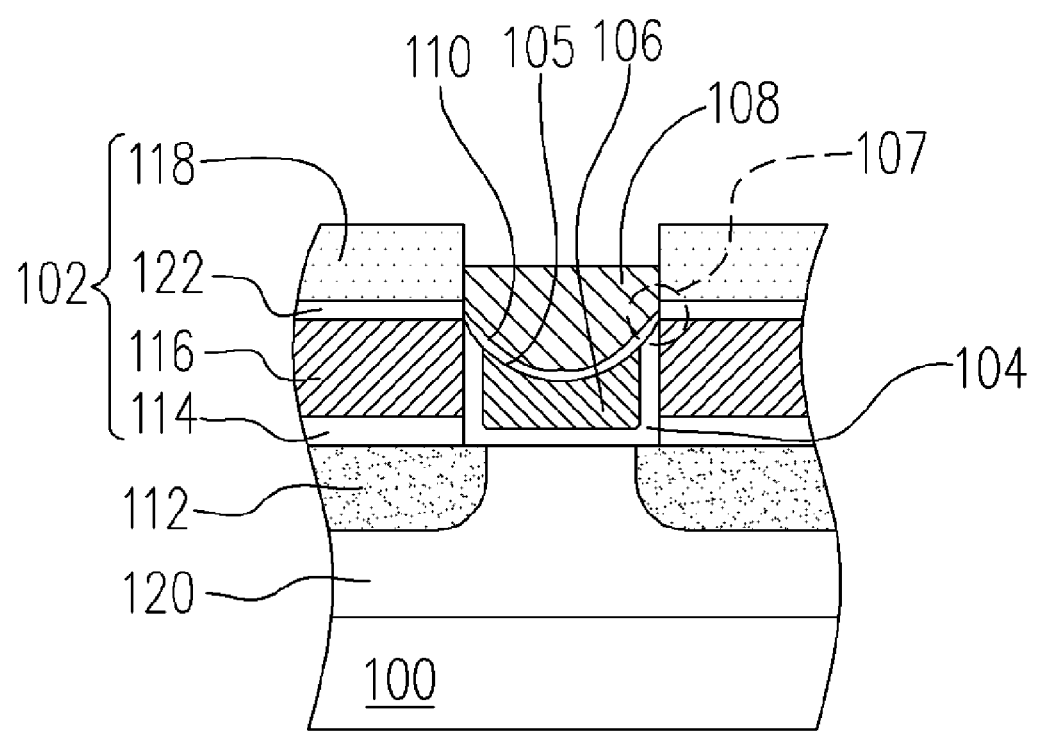
FIG. 2 is an exploded view of part 11 in FIG. 1.

Hereinafter, the memory cell structure in FIG. 1 is described in detail according to FIG. 2. FIG. 2 is an exploded view of part 11 in FIG. 1.

Referring to FIG. 2, each element having the same reference number with that in FIG. 1 is referred to the corresponding element of the NAND flash memory cell of the present invention in FIG. 1. Moreover, besides the floating gate 106 has a concave surface 105 to enhance the gate coupling ratio of the memory cell, the edge 107 of the concave surface 105 is sharp also to increase the erase speed of the memory cell due to the point discharge effect.

FIG. 3A to 3F are cross-sectional views illustrating the process flow of a preferred embodiment of a NAND flash memory cell row according to the present invention.

Referring to FIG. 3A, a substrate 100 is provided. A device isolation structure has been formed on/in the substrate (not shown) to define an active region. Then, a plurality of doping regions 112 and a plurality of source/ drain regions 122 are formed in the substrate 100, wherein the source/drain regions 122 are disposed at the outer side of the periphery of the doping regions 112. Moreover, when the substrate 100 is a p-type silicon substrate, generally a p-type well region 120 is formed in the substrate 100 before the doping regions 112 and the source/drain regions 122 are formed. Further, the depth of the p-type well region 120 is deeper than that of the doping regions 112.

Referring to FIG. 3B, a plurality of the first and second stacked gate structures 102, 130 is formed on the substrate 100, wherein each first stacked gate structure 102 disposed on the doped region 112 has at least an erase gate 116. Moreover, each second stacked gate structure 130 that is disposed at a distance from the doping regions 112 and beside the source/drain regions 122 has at least a select gate 126. The first stacked gate structure 102 includes, for example but not limited to, an erase gate dielectric layer 114, an erase gate 116 and a cap layer having an oxide layer 118a and a dielectric layer 118b. The second stacked gate structure 130 includes, for example but not limited to, a select gate dielectric layer 124, a select gate 126 and a cap layer having an oxide layer 128a and a dielectric layer 128b. The step of forming the first and second stacked gate structures 102 and 130 includes that forming a first dielectric layer, a conductive layer, an oxide layer and a second dielectric layer on the substrate 100 sequentially. The material of the first dielectric layer includes, for example but not limited to, silicon oxide. The material of the conductive layer includes, for example but not limited to, doped amorphous silicon. The material of the second dielectric layer includes, for example but not limited to, silicon nitride. The method of forming the first dielectric layer on the substrate 100 includes a thermal oxidation method. The second dielectric layer, the oxide layer, the conductive layer and the first dielectric layer are patterned to form the dielectric layer 118b, the oxide layer 118a, the erase gate 116 and the erase gate dielectric layer 114 and the dielectric layer 128b, the oxide layer 128a, the select gate 126 and the select gate dielectric layer 124. The oxide layers 118a and 128a include, for example but not limited to, tetraethy- lorthosilicate (TEOS) oxide layer.

Then, referring to FIG. 3C, a tunnel oxide layer 104 is Conned on the substrate 100 to cover the surfaces of the substrate 100, the erase gate 116 and the select gate 126. The material of the tunnel oxide layer 104 includes, for example but not limited to, a silicon oxide. The method of forming the tunnel oxide layer 104 includes, for example but not limited to, a thermal oxidation method. Next, a conductive layer 103 is formed between the stacked gate structures 102 and 130, and then a portion of the constructive layer 103 is removed to make the surface of the conductive layer 103 lower than the top surfaces of the first and second stacked gate structure 102 and 130. The method of removing a portion of the conductive layer 103 includes, for example but not limited to, an etch back method.

Next, referring to FIG. 3D, the top surface of the conductive layer 103 is oxidized to form an oxide layer 111 on the top surface of the conductive layer 103. The method of oxidizing the top surface of the conductive layer 103 includes, for example but not limited to, a wet oxidation method. Since the wet oxidation method will consume a portion of the conductive layer 103, the oxide layer 111 that is finally formed has a thick center and two sharp ends, which shapes like a "birds bean".

Figure 3E:
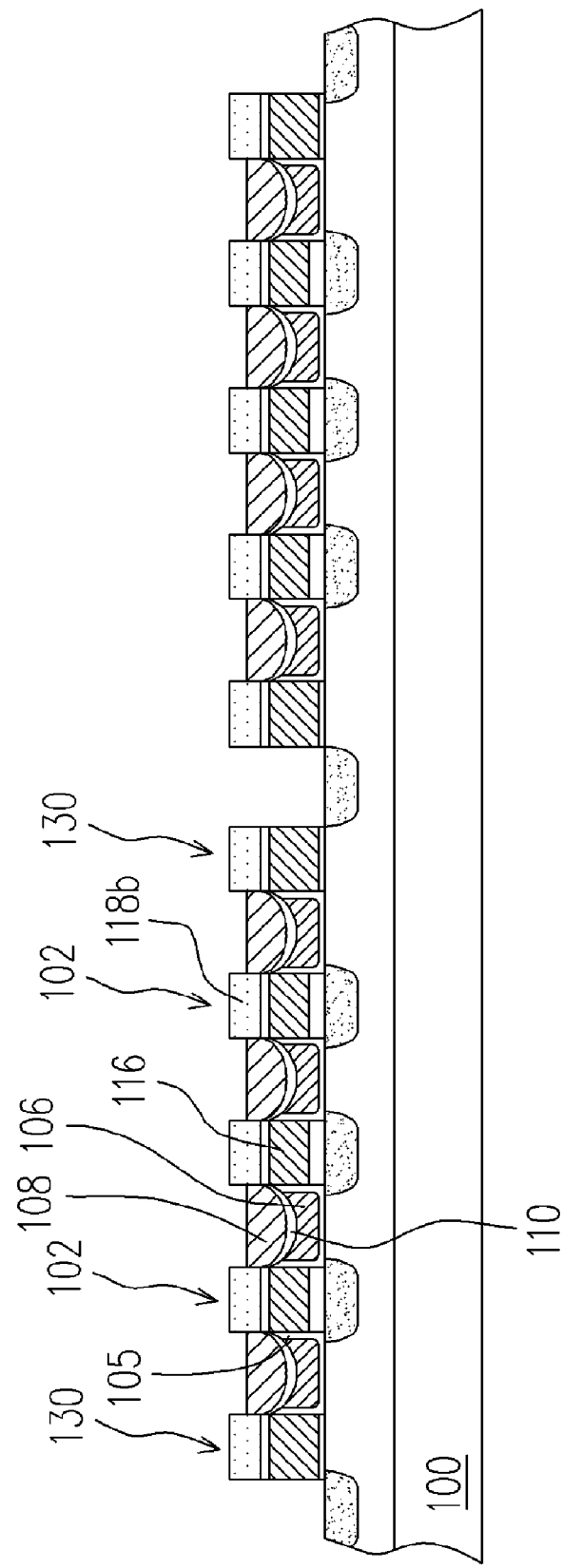

Then, referring to FIG. 3E, the oxide layer 111 is removed (in comparison with FIG. 3D) to form the floating gate 106, wherein the top surface is a concave surface 105 and the edge 107 of the top surface is sharp. The edge of the concave surface 105 is lower than the top surface of the erase gate 116. An inter-gate dielectric layer 110 is further formed on the floating gate 106, and a control gate 108 is formed on the inter-gate dielectric layer 110. The step of forming the control gate 108 includes, for example but not limited to, forming a conductive layer (not shown) on the substrate 100, and removing a portion of the conductive layer till the top surface of the dielectric layer 118b is exposed. The method of removing a portion of the conductive layer includes, for example but not limited to, an etch back method or a chemical mechanical polishing (CMP) method.

Figure 3F:
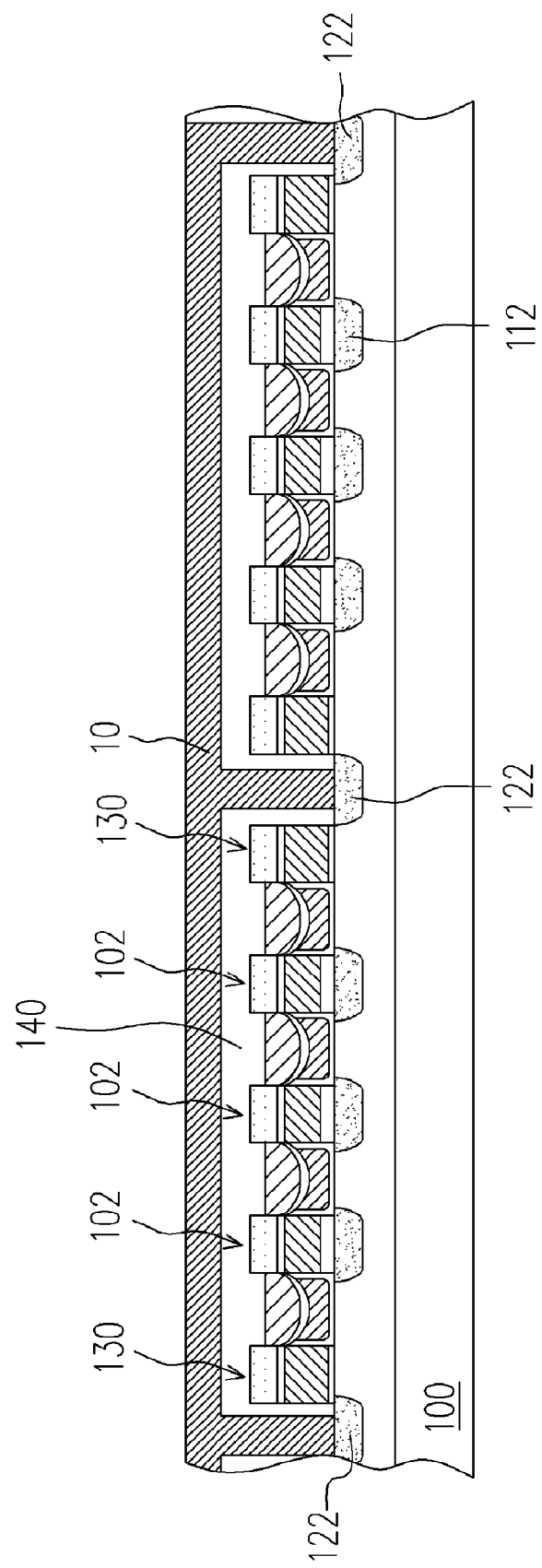

Next, referring to FIG. 3F, in general, a dielectric layer 140 can be formed over the substrate 100 and then a bit line 10 electrically connected with the source/drain 122 can also be formed on the dielectric layer 140 after the memory cell row is formed.

Although in all the foregoing embodiments, the manufacturing method is not related to the NAND flash memory cell row, the embodiments can be applied to at least the manufacturing method of the NAND flash memory cell row, and even to that of the NOR flash memory cell row. Those who skilled in the art can be motivated by the foregoing manufacturing method of the memory cell to achieve the manufacturing method of NAND flash memory cell row of the present invention.

Accordingly, in the present invention, a surface of the floating gate of the NAND flash memory cell is provided as a concave surface. Since not only the junction area between the floating gate and the control gate is increased, the concave surface of the floating gate and the sharp edge of the floating gate is also lower than the top surface of the erase gate. Therefore, the coupling ratio is enhanced. Thus, the erase speed and the performance of the memory cell are enhanced.

Moreover, in the present invention, the thermal oxidation process is provided for the manufacturing of the sharp edge of the floating gate. The oxide formed by the thermal oxidation is then removed to make the floating gate to have a concave surface. Since the edge of the floating gate is sharp, the erase speed and the performance of the memory cell are enhanced.

In addition, in the present invention, an erase gate is disposed between the floating gate and the control gate. Therefore, when an erase operation is performed on the memory cell row, the electrons do not need to be pulled out from the floating gate to the substrate via the tunnel oxide layer. Thus, in the present invention, the damage of the tunnel oxide layer is reduced, and the stability and lifetime of the memory device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A NAND flash memory cell row, comprising:
   a substrate;
   a plurality of first stacked gate structures disposed on the substrate, wherein each of the first stacked gate structures comprises an erase gate dielectric layer, an erase gate and a first cap layer;
   two second stacked gate structures disposed on the substrate beside two outer sides of the first stacked gate structures respectively, wherein each of the second stacked gate structures comprises a select gate dielectric layer, a select gate and a second cap layer;

a plurality of control gates disposed between the first stacked gate structures and each of the second stacked gate structures, and between every two of the neighboring first stacked gate structures;

a plurality of floating gates disposed between the control gates and the substrate, wherein each of the floating gates has sharp corners and a concave surface facing each of the control gates, and the edge of the concave surface is lower than a top surface of the erase gate;

an inter-gate dielectric layer disposed between each of the control gates and each of the floating gates;

a tunnel oxide layer, disposed between each of the floating gates and the substrate, between each of the floating gates and the first stacked gate structures, and between each of the floating gates and the second stacked gate structures;

a plurality of doping regions disposed in the substrate under the first stacked gate structures; and a plurality of source/drain regions disposed in the exposed substrate outside the second stacked gate structures.

2. The NAND flash memory cell row of claim 1, wherein a material of the tunnel oxide layer comprises a silicon oxide.

3. The NAND flash memory cell row of claim 1, wherein the inter-gate dielectric layer comprises a material selected from the group consisting of silicon oxide/silicon nitride/silicon oxide, silicon nitride/silicon oxide and silicon oxide/silicon nitride.

4. The NAND flash memory cell row of claim 1, wherein the first and the second cap layers comprise an oxide layer and a dielectric layer disposed on the oxide layer.

5. The NAND flash memory cell row of claim 1, wherein the NAND flash memory cell further comprising;

a p-type well region disposed in the substrate, wherein a depth of the p-type well region is deeper than a depth of the source/drain regions.

* * * * *